(12) United States Patent
Wang et al.

(10) Patent No.: US 12,490,628 B2
(45) Date of Patent: Dec. 2, 2025

(54) DISPLAY PANEL, MANUFACTURING METHOD THEREOF AND DISPLAY DEVICE

(71) Applicant: HKC CORPORATION LIMITED, Shenzhen (CN)

(72) Inventors: Hailiang Wang, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 384 days.

(21) Appl. No.: 18/350,413

(22) Filed: Jul. 11, 2023

(65) Prior Publication Data

US 2024/0284751 A1 Aug. 22, 2024

(30) Foreign Application Priority Data

Feb. 17, 2023 (CN) .......................... 202310130554.2

(51) Int. Cl.
*H10K 59/50* (2023.01)

(52) U.S. Cl.
CPC .................................. *H10K 59/50* (2023.02)

(58) Field of Classification Search
CPC ...................................................... H10K 59/50
USPC .................................................. 313/498–512
See application file for complete search history.

(56) References Cited

U.S. PATENT DOCUMENTS

2021/0324268 A1 10/2021 Yang et al.
2024/0284704 A1* 8/2024 Wang ................... H10K 50/865
2024/0284747 A1* 8/2024 Wang ..................... H10K 59/38
2024/0298498 A1* 9/2024 Cao ......................... H10K 59/50
2025/0127010 A1* 4/2025 Wei ..................... H10K 59/8051

FOREIGN PATENT DOCUMENTS

| CN | 110137237 | 8/2019 |
| CN | 111063826 | 4/2020 |
| CN | 111326562 | 6/2020 |

(Continued)

OTHER PUBLICATIONS

CNIPA, First Office Action for CN Application No. 202310130554. 2, May 23, 2023.

*Primary Examiner* — Christopher M Raabe
(74) *Attorney, Agent, or Firm* — Hodgson Russ LLP

(57) ABSTRACT

A display panel includes a first substrate plate and a second substrate plate. A blue light-emitting layer on the first substrate plate comprises a display light-emitting component and an anti-view light-emitting component arranged at least between the two display light-emitting components. The second substrate plate includes a second substrate, an anti-view light shielding layer and a quantum dot layer. The anti-view light shielding layer corresponds to the anti-view light-emitting component, and an orthographic projection of the anti-view light-emitting component is located within an orthographic projection of the anti-view light shielding layer. The quantum dot layer includes a display quantum dot cell and an anti-view quantum dot cell arranged at intervals, the display quantum dot cell corresponds to the display light-emitting component, the anti-view quantum dot cell corresponds to the anti-view light-emitting component, and the anti-view quantum dot cell has different colors from two adjacent display quantum dot cells.

19 Claims, 10 Drawing Sheets

(56) References Cited

FOREIGN PATENT DOCUMENTS

| CN | 114326199 | | 4/2022 | |
|----|-----------|---|--------|---|
| CN | 115472658 | | 12/2022 | |
| CN | 115528193 | | 12/2022 | |
| CN | 118742133 A | * | 10/2024 | ........... G06F 3/0412 |
| CN | 118984625 A | * | 11/2024 | ........... H10K 59/126 |

* cited by examiner

DISPLAY PANEL, MANUFACTURING METHOD THEREOF AND DISPLAY DEVICE

CROSS-REFERENCE TO RELATED APPLICATIONS

This application claims priority to Chinese Patent Application No. 202310130554.2, filed Feb. 17, 2023, the entire disclosures of which are incorporated herein by reference.

TECHNICAL FIELD

The present application relates to the field of display technology, more particularly, to a display panel, a manufacturing method and a display device.

BACKGROUND

With the continuous development of display technology, the display panel can achieve a wider color gamut display, Quantum Dot (QD for short) display panel has the characteristics of narrow spectrum, high color purity and wide color gamut, which has unique advantages in the wide color gamut display field.

Quantum dot display panel has a wider viewing angle, which can bring better visual experience to users, but sometimes users also want the viewing angle of display panel to be adjustable, thus effectively protecting trade secrets and personal privacy to avoid business losses or embarrassment caused by screen information leakage. However, now the display panel is inconvenient to switch between normal display and anti-view display.

SUMMARY

There are provided a display panel, a manufacturing method thereof and a display device according to embodiments of the present disclosure. The technical solution is as below:

According to a first aspect of the present application, there is provided a display panel, which includes a first substrate plate, the first substrate plate comprising a first substrate and a blue light-emitting layer formed on the first substrate, the blue light-emitting layer comprising a plurality of display light-emitting components arranged at intervals, the blue light-emitting layer further comprises an anti-view light-emitting component, and the anti-view light-emitting component is arranged at least between two of the plurality of display light-emitting components; the display panel further comprises a second substrate plate, the second substrate plate and the first substrate plate are arranged by cell assembling, and the second substrate plate comprises:

a second substrate opposite to the first substrate;

an anti-view light shielding layer arranged on a side of the second substrate towards the first substrate, an orthographic projection of the anti-view light-emitting component on the first substrate being located within an orthographic projection of the anti-view light shielding layer on the first substrate; and a quantum dot layer disposed at a side of the anti-view light shielding layer away from the second substrate and comprising a display quantum dot cell and an anti-view quantum dot cell arranged at intervals with each other, wherein the display quantum dot cell is disposed opposite to the display light-emitting component, an orthographic projection of the anti-view quantum dot cell on the first substrate overlaps the orthographic projection of the anti-view light-emitting component on the first substrate, and the anti-view quantum dot cell is different in color from at least one display quantum dot cell adjacent to the anti-view quantum dot cell.

According to a second aspect of the present application, there is provided a manufacturing method of a display panel, the method includes:

providing a first substrate, a display light-emitting component and an anti-view light-emitting component being formed on the first substrate to form a first substrate plate;

providing a second substrate, an anti-view light shielding layer and a quantum dot layer being formed on the second substrate to form a second substrate plate;

Laminating sides of the display light-emitting component and the anti-view light-emitting component away from the first substrate of the first substrate plate with a side of the quantum dot layer away from the second substrate of the second substrate plate to form the display panel.

According to a third aspect of the present application, there is provided a display device, which includes a main board and the display panel of any one of the above, the main board is electrically connected to the display panel.

It should be understood that the above general description and the following detailed description are exemplary and explanatory only and are not intended to limit the present application.

BRIEF DESCRIPTION OF DRAWINGS

The accompanying drawings, which are incorporated in and constitute a part of the description, illustrate embodiments consistent with the present application and, together with the description, serve to explain the principles of the present application. It will be apparent that the drawings described below are only some embodiments of the present application, and other drawings may be obtained from them without creative effort for those of ordinary skill in the art.

DESCRIPTION OF THE EMBODIMENTS

The exemplary embodiments will now be described more fully with reference to the accompanying drawings. However, the example embodiments can be implemented in a variety of forms and should not be construed as being limited to the examples set forth herein. Rather, these embodiments are provided so that the present application will be more comprehensive and complete, and the concept of exemplary embodiments will be fully communicated to those skilled in the art.

In the present application, the terms "first". "second" are for descriptive purposes only and cannot be construed as indicating or implying relative importance or implying the number of the indicated technical features. Thus, features defined with "first" and "second" may explicitly or implicitly include one or more of the features. In the description of the present application. "multiple" means two or more unless otherwise expressly specified.

In the present application, unless otherwise explicitly provided and limited, the terms such as "mount," "connect," should be understood broadly, which, for example, may refer to a fixed connection, a detachable connection, or an integral connection; which may refer to a mechanical connection or an electrical connection; which may refer to a direct connection or an indirect connection via an intermediate medium; which may also refer to a communication between the insides of two elements. For those ordinarily skilled in the art, the specific meanings of the above terms in the present application will be understood according to the specific circumstances.

Further, the described features, structures or characteristics may be incorporated in any suitable manner in one or more embodiments. In the following description many specific details are provided to give a full understanding of the embodiments of the present application. However, those skilled in the art will appreciate that the technical aspects of the present application may be practiced without one or more of the specific details, or other methods, components, devices, steps and the like may be employed. In other instances, the common methods, devices, implementations or operations are not shown or described in detail to avoid obscuring aspects of the present application.

Embodiment 1

Figure 1:
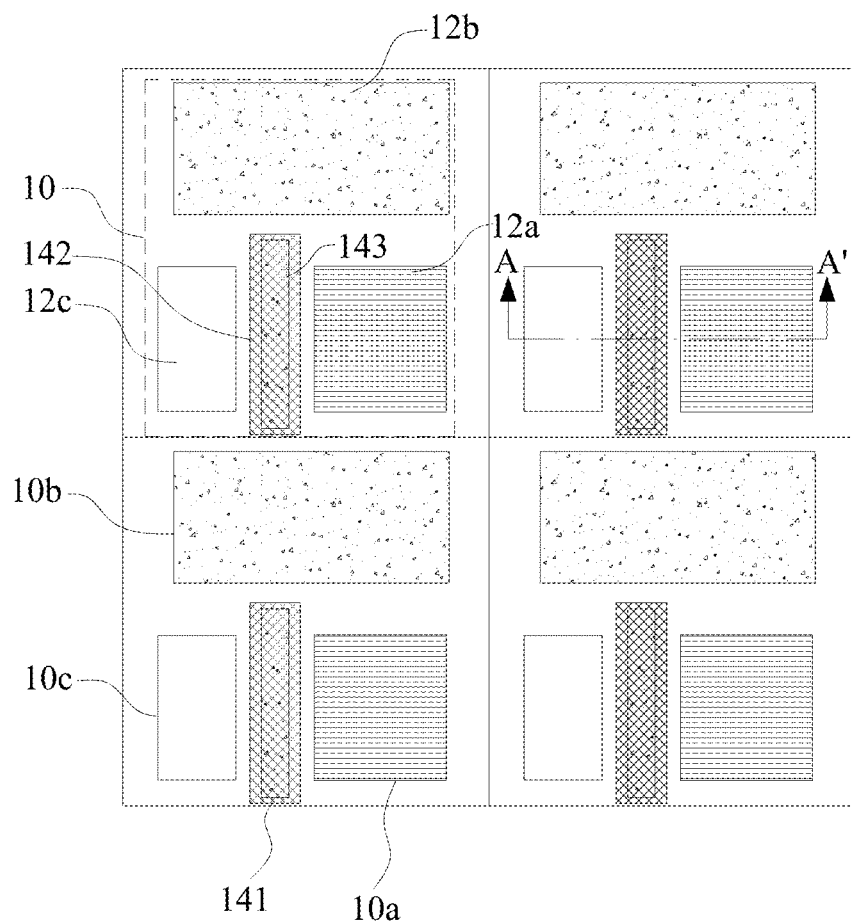
FIG. 1 shows a structural diagram of a partial pixel cell array arrangement provided in embodiment 1 of the present application.
Figure 2:
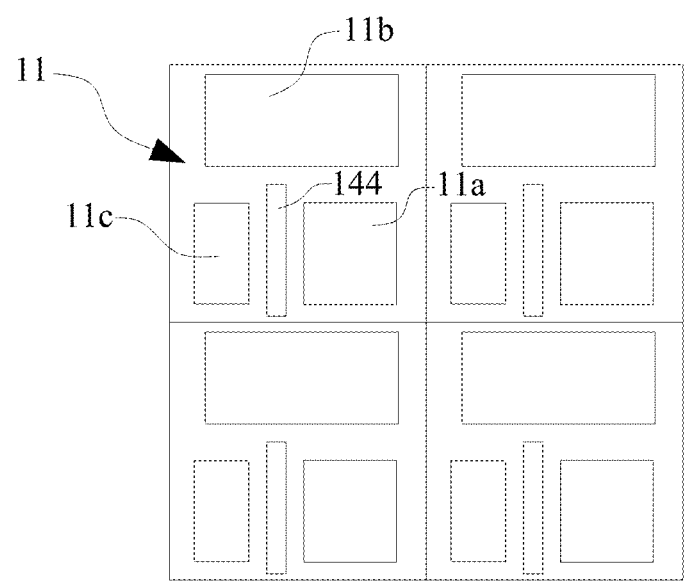
FIG. 2 shows a structural diagram of a display light-emitting component and an anti-view light-emitting component provided in embodiment 1 of the present application.
Figure 3:
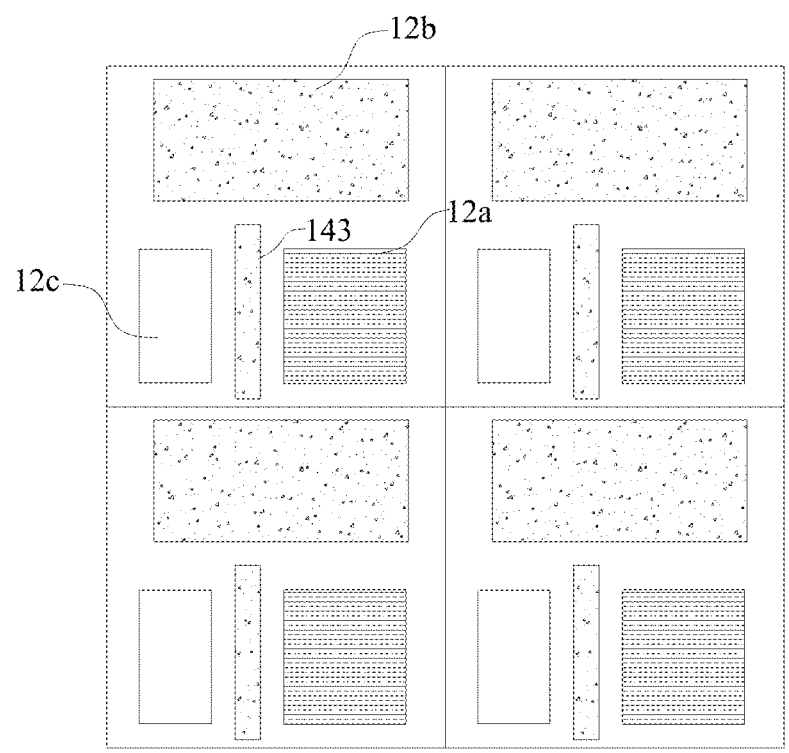
FIG. 3 shows a structural diagram of a display quantum dot cell and an anti-view quantum dot cell provided in embodiment 1 of the present application.

Embodiment 1 provides a display panel 1, which, as shown in FIGS. 1, 2 and 3, includes a plurality of pixel cells 10 arranged in an array. In embodiments of the present application, each of the pixel cells 10 includes three sub-pixels arranged at intervals, namely, a red sub-pixel 10a, a green sub-pixel 10b and a blue sub-pixel 10c.

The red sub-pixel 10a, the green sub-pixel 10b, and the blue sub-pixel 10c each include a display light-emitting component 11 that emit blue light, which are respectively a first display light-emitting component 11a, a second display light-emitting component 11b, and a third display light-emitting component 11c. In order to allow the red sub-pixel 10a to achieve the red display, the green sub-pixel 10b to achieve the green display and the blue sub-pixel 10c to achieve the blue display, the red sub-pixel 10a also includes a red quantum dot cell 12a, the green sub-pixel 10b includes a green quantum dot cell 12b and the blue sub-pixel 10c includes a transparent cell 12c, and the red quantum dot cell 12a, the green quantum dot cell 12b and the transparent cell 12c are separated by light shielding posts 13 to avoid cross-color and ensure the display effect.

It should be noted that the first display light-emitting component 11a corresponds to the red quantum dot cell 12a, and it can be understood that the orthographic projection of the first display light-emitting component 11a can be located in the red quantum dot cell 12a. The orthographic projection of the first display light-emitting component 11a may partially overlap the red quantum dot cell 12a. It may also be that the orthographic projection of the first display light-emitting component 11a completely overlaps the red quantum dot cell 12a. It is only necessary to ensure that the red quantum dot cell 12a can be excited to emit red light.

Accordingly, the second display light-emitting component 11b and the green quantum dot cell 12b as well as the third display light-emitting component 11c and the transparent cell 12c may also be used in the same manner as described above.

Addition, It can be understood that when the blue light emitted by the first display light-emitting component 11a passes into the red quantum dot, the red quantum dot cell 12a is excited to emit red light. When the blue light emitted by the second display light-emitting component 11b passes into the green quantum dot, the green quantum dot cell 12b is excited to emit green light. The blue light emitted by the third display light-emitting component 11c passes into the transparent cell 12c to present the blue light. Color display of the display panel 1 is achieved by exciting the red quantum dot cell 12a to emit red light, exciting the green quantum dot cell 12b to emit green light, and blue light emitted through the transparent cell 12c.

It should be noted that since the blue sub-pixel 10c includes the display light-emitting component 11 that emits blue light, the blue sub-pixel 10c does not need to be provided with the blue quantum dot cell, thereby reducing the production cost.

Further, the transparent cell 12c may be made of an organic insulating dielectric material (OC), i.e., the display light-emitting component 11 can emit blue light through the transparent cell 12c.

Figure 4:
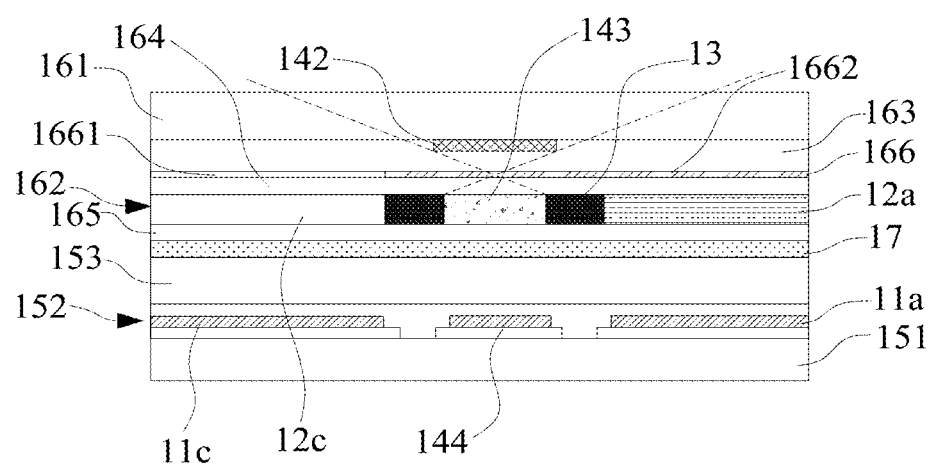
FIG. 4 shows a sectional schematic diagram taken in a line A-A' in FIG. 1.

Referring to FIGS. 1 and 4, in order to achieve the anti-view function for the display panel 1, the display panel 1 further includes an anti-view pixel cell including an anti-view sub-pixel 141 and an anti-view light shielding layer 142. The anti-view light shielding layer 142 corresponds to the anti-view sub-pixel 141.

In this embodiment, the display panel 1 includes a plurality of anti-view pixel cells, each of the anti-view pixel cells includes one anti-view sub-pixel 141. Each pixel cell 10 is provided with one anti-view sub-pixel 141, the anti-view sub-pixel 141 is located between two adjacent sub-pixels. The two adjacent sub-pixels may be a red sub-pixel 10a and a green sub-pixel 10b, or a green sub-pixel 10b and a blue sub-pixel 10c, or a red sub-pixel 10a and a blue sub-pixel 10c. When the anti-view sub-pixel 141 is located between two sub-pixels, the anti-view sub-pixel 141 presents a color different from the two sub-pixels, which is the same color as one of the non-adjacent sub-pixels in the pixel cell 10.

It should be noted that the anti-view sub-pixel 141 also includes an anti-view light-emitting component 144 which emits blue light and an anti-view quantum dot cell 143 which presents a different color from the adjacent sub-pixels.

For example, when the anti-view sub-pixel 141 is located between the blue sub-pixel 10c and the red sub-pixel 10a, the anti-view sub-pixel 141 appears the same color as the green sub-pixel 10b, that is, the anti-view sub-pixel 141 appears green. That is, the anti-view quantum dot cell 143 in the anti-view sub-pixel 141 is excited by the blue light emitted by the anti-view light-emitting component 144 to appear green, which is different from the light emitted by the adjacent transparent cell 12c and the red quantum dot cell 12a.

In addition, referring to FIG. 1, in one pixel cell 10, the blue sub-pixels 10c and the red sub-pixels 10a may be arranged at intervals on the same row, and the anti-view sub-pixels 141 are also arranged at intervals in the same row direction with the blue sub-pixels 10c and red sub-pixels 10a, and the green sub-pixels 10b correspond to the red sub-pixels 10a, the blue sub-pixels 10c and the anti-view sub-pixels 141 in the column direction. The embodiments of the present application adopt such a structure, which can increase the aperture ratio of a pixel cell 10, and can also adjust the area size occupied by corresponding sub-pixels according to different required colors. For example, the required green color is the largest and the blue color is the smallest, the green sub-pixel 10b has the largest area, the blue sub-pixel 10c has the smallest area, and the red sub-pixel 10a has an area between them.

It is worth mentioning that when the anti-view sub-pixel 141 is located between adjacent sub-pixels, the length of the anti-view sub-pixel 141 in the column direction is larger than the length of the adjacent two sub-pixels in the column direction, so that the light emitted by the adjacent two sub-pixels can be better mixed with that of the anti-view sub-pixel 141 to ensure the anti-view effect.

Further, as shown in FIG. 4, the anti-view light shielding layer 142 corresponds to the anti-view sub-pixel 141. It is to be understood that the orthographic projection of the anti-view sub-pixel 141 is located inside the anti-view light shielding layer 142 to ensure the front-viewing angle.

The anti-view light shielding layer 142 may be made of a black matrix (BM), i.e., made of a black material to ensure that a normal display screen can be viewed from the front viewing angle. In squint, the anti-view light-emitting component 144 emits blue light, excites the anti-view quantum dot cell 143 to emit light different from the adjacent sub-pixels, mixes the light emitted by the adjacent sub-pixels, interferes with the reading of information, and further causes the squint angle information to be read incorrectly, resulting in the wide angle of view not being visible. Since the anti-view light shielding layer 142 corresponds to the anti-view sub-pixel 141, in the front-viewing, the anti-view light shielding layer 142 shields the light emitted by the anti-view quantum dot cell 143, so that the front-viewing is normal, and the narrow viewing angle is visible, but the wide viewing angle is invisible, thereby achieving the anti-view function. When the anti-view light-emitting component 144 is turned off, the anti-view quantum dot cell 143 does not mix the light emitted by adjacent sub-pixels, does not interfere with the reading of information, and makes the squint (wide viewing angle) display normal, thereby achieving wide viewing angle display.

That is to say, by turning on or off the anti-view light-emitting component 144, one-key switching of wide viewing angle or narrow viewing angle display can be achieved, and the switching of wide viewing angle and narrow viewing angle is simpler and the operation is more convenient.

It is worth mentioning that the pixel cell 10 may also include three or more sub-pixels of different colors, for example, a red sub-pixel 10a, a green sub-pixel 10b, a blue sub-pixel 10c and a yellow sub-pixel. The anti-view sub-pixel 141 is arranged between the adjacent two of the red sub-pixel 10a, the green sub-pixel 10b, the blue sub-pixel 10c and the yellow sub-pixel, and emits light of different colors from the adjacent sub-pixels. By turning on or off the anti-view light-emitting component 144, one-key switching between normal display and anti-view display can be achieved.

Further, in order to more conveniently manufacture the anti-view light shielding layer 142 and the display quantum dot cell, the display panel 1 includes a first substrate plate 15 and a second substrate plate 16 arranged by cell assembling.

Figure 5:
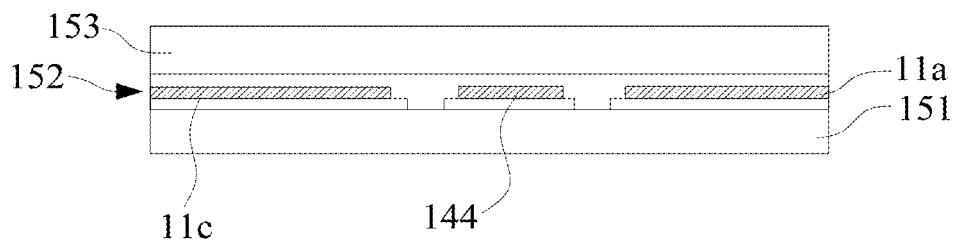
FIG. 5 shows a structural diagram of the first substrate plate provided in embodiment 1, embodiment 7 or embodiment 8 of the present application.

As shown in FIG. 5, the first substrate plate 15 includes a first substrate 151 and a blue light emitting layer 152 formed on the first substrate 151. The blue light emitting layer 152 includes a plurality of display light-emitting components 11 arranged at intervals, and three display light-emitting components 11 arranged at intervals constitute the first display light-emitting component 11a, the second display light-emitting component 11b and the third display light-emitting component 11c of the pixel cell 10 described above. In addition, the anti-view light-emitting component 144 is located between the two display light-emitting components 11, so as to facilitate color mixing of light emitted by adjacent sub-pixels and achieve the anti-view function.

It should be noted that the first substrate 151 may be a rigid substrate made of glass, but is not limited thereto, and may also be a flexible substrate made of a material such as polyimide (abbreviated as polyimide). That is, the display panel 1 of the present application is not limited to a rigid non-bendable panel, but may also be a flexible bendable panel.

It should be understood that in order to achieve the display of the display light-emitting component 11 and the anti-view light-emitting component 144, at the display light-emitting component 11, an anode, the display light-emitting component 11 and a cathode are sequentially stacked on the first substrate 151; and at the anti-view light-emitting component 144, the anode, the anti-view light-emitting component 144 and the cathode are stacked on the first substrate 151 in sequence.

The anodes corresponding to the display light-emitting component 11 and the anti-view light-emitting component 144 are arranged at intervals, so that the display light-emitting component 11 and the anti-view light-emitting component 144 can be driven independently of each other, thereby achieving switching between normal display and anti-view display, so that the embodiments of the present application can achieve one-key switch to anti-view; and the switching between anti-view and normal display is convenient and simple. In addition, the anodes of the display light-emitting components 11 in each pixel cell 10 may be connected to each other to achieve simultaneous on and simultaneous off state, and the control is simpler. The anodes of the anti-view light-emitting component 144 can also be connected to each other to achieve simultaneous on or simultaneous off state. Of course, the anodes of the anti-view light-emitting component 144 can also be disconnected from each other to be controlled one by one for more precise control.

It should be noted that the anode may be indium tin oxide (ITO), indium zinc oxide (IZO), zinc oxide (ZnO) or indium oxide ($In_2O_3$).

Next, the display light-emitting component 11 and the anti-view light-emitting component 144 may include at least two layers of stacked light-emitting parts, for example, the display light-emitting component 11 or the anti-view light-emitting component 144 is formed by stacking two layers of blue light-emitting parts in the thickness direction of the first substrate 151; or the display light-emitting component 11 or the anti-view light-emitting component 144 is formed by stacking three layers of blue light emitting parts in the thickness direction of the first substrate 151.

It should be noted that the thicknesses of the display light-emitting component 11 and the anti-view light-emitting component 144 are 0 to 10 μm, for example, 1 μm, 2 μm, 3 μm, 4 μm, 4.5 μm, 5 μm, 5.5 μm, 6 μm, 6.5 μm, 7 μm, 7.5 μm, 8 μm, 8.5 μm, 9 μm, 9.5 μm and 10 μm.

In addition, the cathode of the display light-emitting component 11 and the cathode of the anti-view light-emitting component 144 may be connected to each other to form electrodes of an entire surface to reduce the manufacturing cost. The cathode may include a low work function material layer comprising Li, Ca, LiF/Ca, LiF/Al, Al, Mg, Ag, Pt, Pd, Ni, Au, Nd, Ir, Cr, $BaF_2$, Ba, compounds thereof, or mixtures thereof. For example, the cathode may include a low work function material layer made from a mixture of Ag and Mg.

Further, as shown in FIG. 5, the first substrate plate 15 further includes a first encapsulation layer 153, the first encapsulation layer 153 is arranged on a side of the cathode away from the first substrate 151, and can block water and oxygen outside, to avoid affecting the working states of the display light-emitting component 11 and the anti-view light-emitting component 144.

Figure 6:
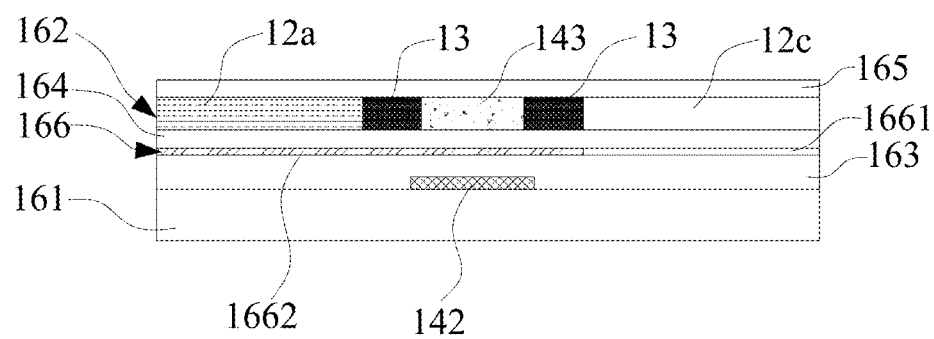
FIG. 6 shows a structural diagram of the second substrate plate provided in embodiment 1, embodiment 7 or embodiment 8 of the present application.

Next, as shown in FIG. 6, the second substrate plate 16 includes a second substrate 161, an anti-view light shielding layer 142 and a quantum dot layer 162, the second substrate 161 and the first substrate 151 correspond to each other, and the quantum dot layer 162 is disposed on a side of the anti-view light shielding layer 142 away from the second substrate 161.

The second substrate 161 may be a rigid substrate made of glass, but is not limited thereto, and may also be a flexible substrate made of a material such as polyimide (abbreviated as polyimide). That is, the display panel 1 of the present application is not limited to a rigid non-bendable panel, but may also be a flexible bendable panel.

The thickness of the second substrate 161 is 0.1 millimeters (mm) to 0.2 millimeters (mm), and may be, for example, 0.1 mm, 0.12 mm, 0.14 mm, 0.16 mm, 0.18 mm, 0.2 mm.

Secondly, the anti-view light shielding layer 142 is arranged on a side of the second substrate 161 towards the first substrate 151, and the anti-view light shielding layer 142 corresponds to the anti-view light-emitting component 144, and an orthographic projection of the anti-view light-emitting component 144 on the first substrate 151 is located within an orthographic projection of the anti-view light shielding layer 142 on the first substrate 151, so as to completely block the anti-view light-emitting component 144 in the front-viewing angle, and avoid affecting the viewing effect in the front-viewing angle.

The anti-view light shielding layer 142 may be made of a metallic material such as Molybdenum (Mo) or Titanium (Titanium. Ti). Alternatively, the anti-view light shielding layer 142 is made of a nonmetallic material such as a black matrix material (BM) or an organic photoresist plus carbon black.

When the anti-view light shielding layer 142 is made of a metallic material, the thickness of the anti-view light shielding layer 142 may be 0.1 microns (μm) to 0.6 microns (μm), for example, may be 0.1 μm, 0.2 μm, 0.3 μm, 0.4 μm, 0.5 μm, 0.6 μm. When the anti-view light shielding layer 142 is made of a non-metallic material, the thickness of the anti-view light shielding layer 142 may be 0.5 microns (μm) to 3 microns (μm), for example, may be 0.5 μm, 0.6 μm, 0.7 μm, 0.8 μm, 0.9 μm, 1 μm, 1.5 μm, 1.8 μm, 2 μm, 2.5 μm, 2.8 μm and 3 μm.

It can be understood that when the anti-view light shielding layer 142 is made of a metallic material and a nonmetallic material, the thickness of the corresponding anti-view light shielding layer 142 is different to ensure that light cannot pass through the anti-view light shielding layer 142 in the front-viewing, thereby ensuring that the front-viewing angle is normal.

In addition, the quantum dot layer 162 is arranged on the side of the anti-view light shielding layer 142 away from the second substrate 161. The quantum dot layer 162 includes display quantum dot cells and anti-view quantum dot cells 143 arranged at intervals with each other. The display quantum dot cells correspond to the display light-emitting component 11, and the anti-view quantum dot cells 143 corresponds to the anti-view light-emitting component 144. The anti-view quantum dot cells 143 have different colors from the adjacent two display quantum dot cells, so that when the display quantum dot cells emit light and the anti-view quantum dot cells emit light, the anti-view quantum dot cells 143 can mix colors of the light emitted by the adjacent two display quantum dot cells and interfere with the information reading from the squint view angle, thereby achieving anti-view.

An example of a pixel cell 10 including a red sub-pixel 10a, a green sub-pixel 10b and a blue sub-pixel 10c and one anti-view sub-pixel 141 will be explained.

In one pixel cell 10, the quantum dot layer 162 includes a red quantum dot cell 12a, a green quantum dot cell 12b, a transparent cell 12c and an anti-view quantum dot cell 143. The red quantum dot cell 12a corresponds to the first display light-emitting component 11a on the first substrate plate 15 so that blue light excites the quantum dots in the red quantum dot cell 12a to emit red light, the green quantum dot cell 12b corresponds to the second display light-emitting component 11b on the first substrate plate 15 so that blue light excites the quantum dots in the green quantum dot cell 12b to emit green light, the transparent cell 12c corresponds to a third display light-emitting component 11c so that the light emitted by the third display light-emitting component 11c directly pass through the transparent cell 12c to display blue, thereby achieving color display of the display panel 1. The anti-view quantum dot cell 143 corresponds to the anti-view light-emitting component 144 on the first substrate plate 15 to emit light under the excitation of the anti-view light-emitting component 144.

The color of the anti-view quantum dot cell 143 is different from that of two adjacent quantum dots, so as to mix the colors of light emitted by adjacent quantum dots, thereby achieving the anti-view function.

For example, when the anti-view quantum dot cell 143 is located between the red quantum dot cell 12*a* and the transparent cell 12*c*, the anti-view quantum dot cell 143 may use the same quantum dots as those in the green quantum dot cell 12*b*, that is, the blue light emitted by the anti-view light-emitting component 144 excites the anti-view quantum dot cell 143 to emit green light.

When the anti-view quantum dot cell 143 is located between the red quantum dot cell 12*a* and the green quantum dot cell 12*b*, the anti-view quantum dot cell 143 may use the same quantum dot as in the transparent cell 12*c*, that is, the blue light emitted by the anti-view light-emitting component 144 emits blue light through the transparent cell 12*c*.

When the anti-view quantum dot cell 143 is located between the green quantum dot cell 12*b* and the transparent cell 12*c*, the anti-view quantum dot cell 143 may emit red light by using the same quantum dots as those in the red quantum dot cell 12*a*, that is, the blue light emitted by the anti-view light-emitting component 144 excites the anti-view quantum dot cell 143.

Further, as shown in FIGS. 4 and 6, light-shielding posts 13 are disposed between either two of the anti-view quantum dot cell 143, the red quantum dot cell 12*a*, the green quantum dot cell 12*b*, and the transparent cell 12*c*, and the light-shielding posts 13 may be made of a black light-shielding material, such as Molybdenum (Mo) or Titanium (Titanium. Ti) and the like, so as to provide accommodation space for quantum dots and avoid cross-color between quantum dots.

Further, the orthographic projection of the anti-view light shielding layer 142 corresponding to the anti-view quantum dot cell 143 on the first substrate 151 partially overlaps the orthographic projection of the light shielding posts 13 on both sides of the anti-view quantum dot cell 143 on the first substrate 151, so as to avoid better shielding the anti-view quantum dot cell 143 when the anti-view quantum dot cell 143 emits light and avoid affecting the front-viewing angle.

In addition, as shown in FIG. 6, the second substrate plate 16 further includes a flat layer 163 and a second encapsulation layer 164 and a third encapsulation layer 165 arranged on the upper and lower sides of the quantum dot layer 162.

The planarization layer 163 is arranged on the second substrate 161 and completely covers the anti-view light shielding layer 142 on the second substrate 161, so as to achieve the planarization effect and ensure that the surface is flat and closely attached. The flat layer 163 may be made of an organic insulating dielectric material (OC).

The second encapsulation layer 164 is located on a side of the flat layer 163 away from the second substrate 161, and the third encapsulation layer 165 is located on a side of the quantum dot layer 162 away from the second substrate 161. The quantum dots are sealed by the second encapsulation layer 164 and the third encapsulation layer 165 to avoid leakage of the quantum dots and affect the display effect.

The second encapsulation layer 164 and the third encapsulation layer 165 may be an inorganic encapsulation layer, which is better than an organic encapsulation layer in insulating water and oxygen.

Further, as shown in FIG. 6, in order to improve the purity of the emitted light of the red quantum dot cell 12*a* and the green quantum dot cell 12*b*, a blue light absorption layer 166 is further provided between the flat layer 163 and the second encapsulation layer 164 for absorbing the blue light remaining after the first display light-emitting component 11*a* and the second display light-emitting component 11*b* pass through the red quantum dot cell 12*a* and the green quantum dot cell 12*b*, thereby improving the purity of the emitted light of the red light and the green light so that the red light is redder and the green light is greener.

Figure 7:
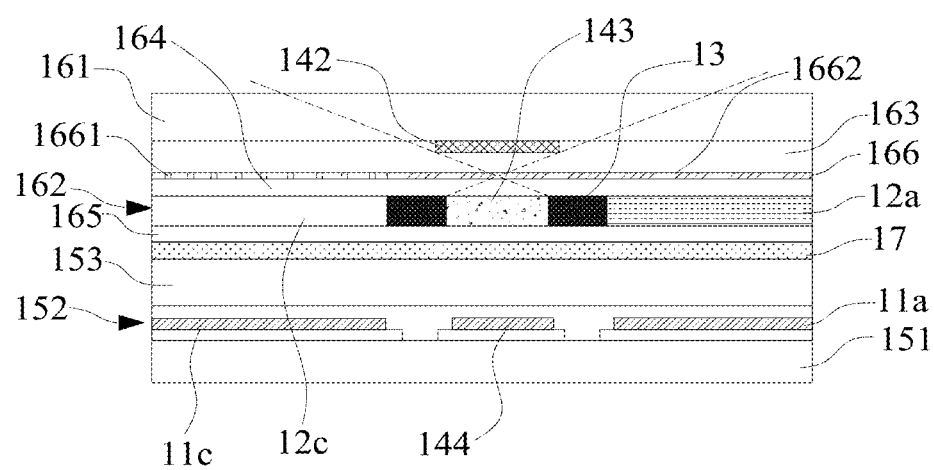
FIG. 7 is a structural diagram of an opening area being a pore structure provided in embodiment 1, embodiment 7 or embodiment 8 of the present application.

It is worth mentioning that as shown in FIGS. 4 and 7, a portion of the blue light absorption layer 166 corresponding to the transparent cell 12*c* may transmit at least part of the blue light.

In the embodiments of the present application, the blue light absorption layer 166 includes an opening area 1661 and an absorption area 1662. The absorption area 1662 is arranged around the opening area 1661, the opening area 1661 corresponding to the transparent cell 12*c*, and the absorption area 1662 corresponding to the red quantum dot cell 12*a*, the anti-view quantum dot cell 143 and the green quantum dot cell 12*b*, so as to absorb blue light existing in the emitted light and improve the purity of the light.

As shown in FIG. 4, the opening area 1661 may be completely open with an opening area being equal to or slightly larger than that of the transparent cell 12*c*. Referring to FIG. 7, the opening area 1661 may be of a pore structure, and a plurality of such pore structures are provided in the opening area 1661, and blue light passing through the transparent cell 12*c* is partially emitted through the pores, thereby reducing the light output rate of the blue light.

It should be noted that by providing the blue light absorption layer 166, the process of coating the color resistance layer on the quantum dot layer 162 can be reduced, the process difficulty can be reduced, the process yield can be greatly improved, and the cost can be reduced.

In addition, the blue light absorption layer 166 may be made of a (1, 3-phenylene) bis (1-(alkoxyphenyl)-1, 3-propanedione) compound, which can effectively absorb blue light.

It is worth mentioning that the anti-view light shielding layer 142 and the quantum dot layer 162 are provided on the second substrate plate 16, so that the anti-view light shielding layer 142 and the quantum dot layer 162 and the display organic light-emitting component and the anti-view light-emitting component 144 are manufactured independently of each other, so that the anti-view light shielding layer 142 and the quantum dot layer 162 and the like can be manufactured on the second substrate plate 16 using a conventional non-OLED low-temperature process, thus better protecting the display organic light-emitting component and the anti-view light-emitting component 144, improving the yield and reducing the production cost.

In addition, the first substrate plate 15 and the second substrate plate 16 may be connected by adhesion or electrostatic adsorption.

For example, as shown in FIG. 4, when the first substrate plate 15 and the second substrate plate 16 are bonded, the display panel 1 further includes a bonding layer 17, one side of the bonding layer 17 is bonded to the side of the first encapsulation layer 153 of the first substrate plate 15 away from the first substrate 151, and the other side of the bonding layer 17 is bonded to the side of the third encapsulation layer 165 of the second substrate plate 16 away from the second substrate 161.

Figure 8:
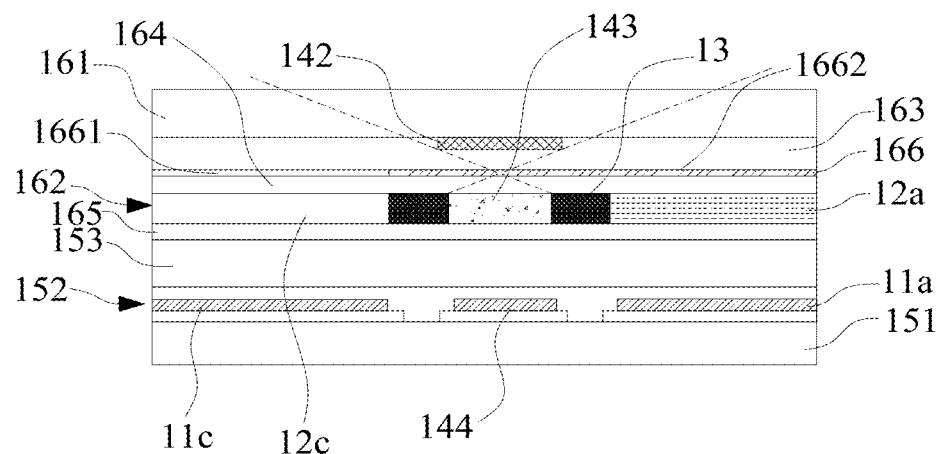
FIG. 8 shows a structural diagram of electrostatic adsorption between a first substrate plate and a second substrate plate provided in embodiment 1, embodiment 7 or embodiment 8 of the present application.

As shown in FIG. 8, when the first substrate plate 15 and the second substrate plate 16 are connected by bonding or electrostatic adsorption, the display panel 1 can be bent for display since the polarizing layer is not provided on the side of the second substrate plate 16 away from the first substrate plate 15.

Figure 9:
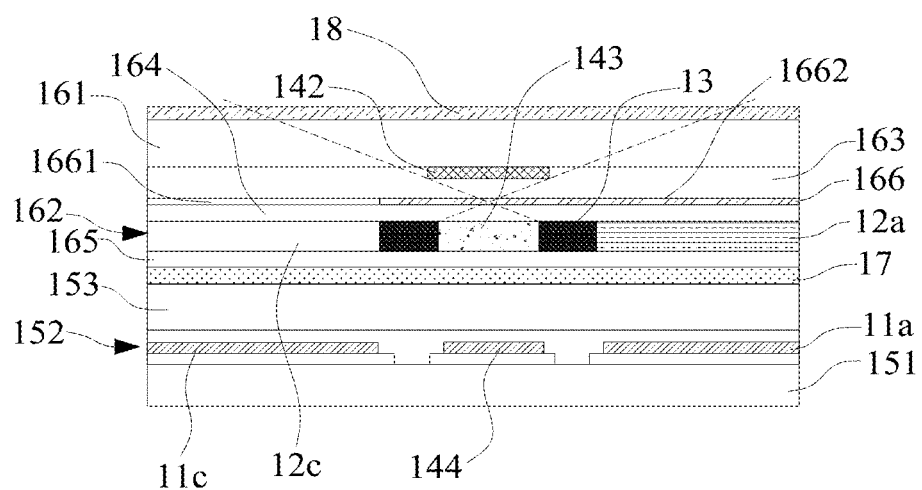
FIG. 9 shows a structural diagram of an anti-reflection layer provided on a side of the second substrate plate away from the first substrate plate provided in embodiment 1, embodiment 7 or embodiment 8 of the present application.

Further, as shown in FIG. 9, the display panel 1 further includes an anti-reflection layer 18. The anti-reflection layer 18 is arranged on the side of the second substrate plate 16 away from the first substrate plate 15. The anti-reflection layer 18 can reduce the reflection intensity of ambient light on the screen, thereby eliminating the polarizer of the display panel 1, which not only reduces the overall thickness of the display panel 1, but also may improve the light output rate. The brightness of the emitted light is greatly increased, so that the power consumption of the display panel 1 is also reduced.

The present application discloses a display panel, a manufacturing method thereof and a display device. During the anti-view, the anti-view light-emitting component emits light, the anti-view quantum dot cell is excited by the light of the anti-view light-emitting component to present a color different from the adjacent two display quantum dot cells and is mixed with the light emitted by the adjacent two display quantum dot cells, to interfere with the reading of information. In addition, due to the function of the anti-view light shielding layer, the light emitted by the anti-view quantum dot cell is shielded by the anti-view shielding layer while viewing at a front side, so as not to affect the frontal vision effect, and the narrow viewing angle is visible and the wide viewing angle is invisible, thus achieving the anti-view. During normal display, the anti-view light-emitting component is turned off, and the anti-view quantum dot cell is in a black state when there is no light transmission, that is, light is blocked, which does not affect the reading of information under a large viewing angle, and the viewing at both front and side are normal, thereby achieving display in the wide viewing angle.

In addition, the display panel comprises a first substrate plate and a second substrate plate. By arranging the anti-view light shielding layer and the quantum dot layer on the second substrate plate, the anti-view light shielding layer and the quantum dot layer can be manufactured by a low-temperature process on the second substrate plate, thereby avoiding damage to the display light-emitting component and the anti-view light-emitting component on the first substrate plate, improving the yield of the display panel and reducing the cost.

Embodiment 2

Figure 10:
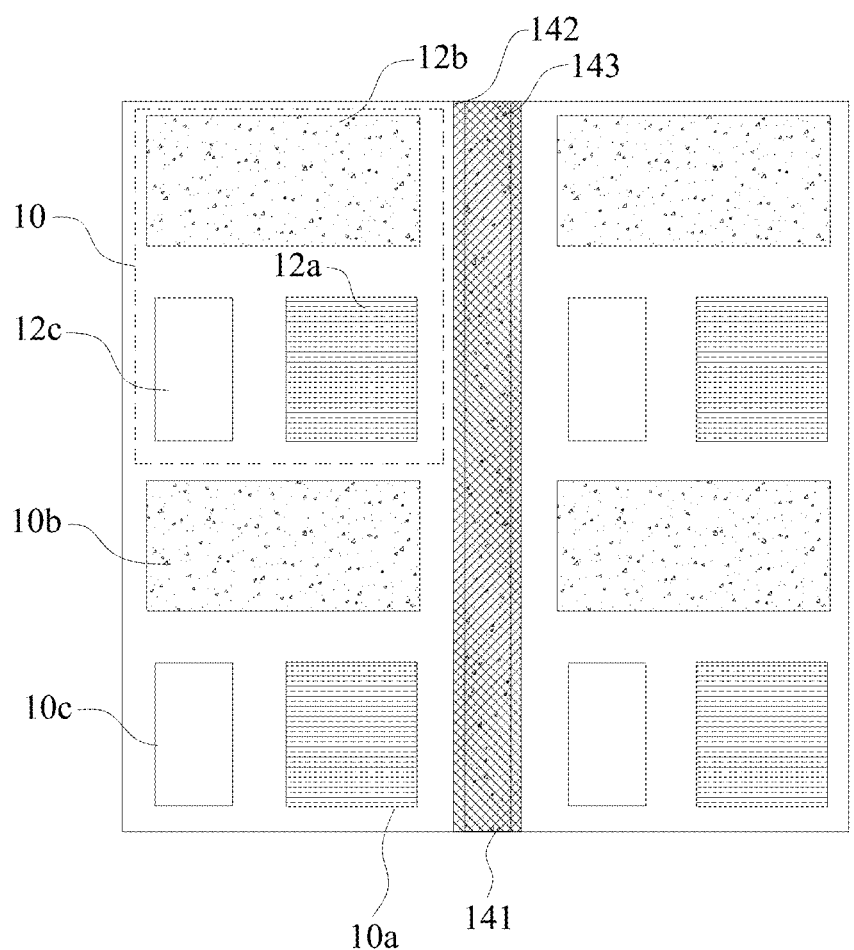
FIG. 10 is a structural diagram of the anti-view sub-pixels extending in a column direction provided in embodiment 2 or embodiment 8 of the present application.

Embodiment 2 is different from embodiment 1 in that, as shown in FIG. 10, the anti-view pixel cell in embodiment 2 is located between the pixel cells 10 in two adjacent columns, the anti-view pixel cell includes one anti-view sub-pixel 141, and the anti-view sub-pixel 141 is extended in the column direction.

The anti-view sub-pixel 141 is different in color from at least one adjacent sub-pixel, for example, the sub-pixel in the pixel cell 10 on the left side of the anti-view sub-pixel 141 is the red sub-pixel 10*a*, and the sub-pixel in the pixel cell 10 on the right side of the anti-view sub-pixel 141 is the blue sub-pixel 10*c*, and the anti-view sub-pixel 141 can be either a blue sub-pixel or a red sub-pixel.

It needs to note that when either of the red sub-pixel 10*a* or the blue sub-pixel 10*c* does not emit light, the anti-view sub-pixel 141 can replace the red sub-pixel 10*a* or the blue sub-pixel 10*c* to emit red or blue light, thereby ensuring a normal display effect while ensuring the anti-view function.

For example, when the anti-view sub-pixel 141 is located between the blue sub-pixel 10*c* and the red sub-pixel 10*a*, the blue sub-pixel 10*c* is damaged and does not emit light, and the anti-view sub-pixel 141 shows blue. When the anti-view sub-pixel 141 is turned on, the blue light is mixed with the light at the red sub-pixel 10*a* to interfere with the reading of information here, thereby achieving anti-view, while the other side of the anti-view sub-pixel 141 emits blue light instead of the blue sub-pixel 10*c*, thereby achieving normal display.

Embodiment 3

Figure 11:
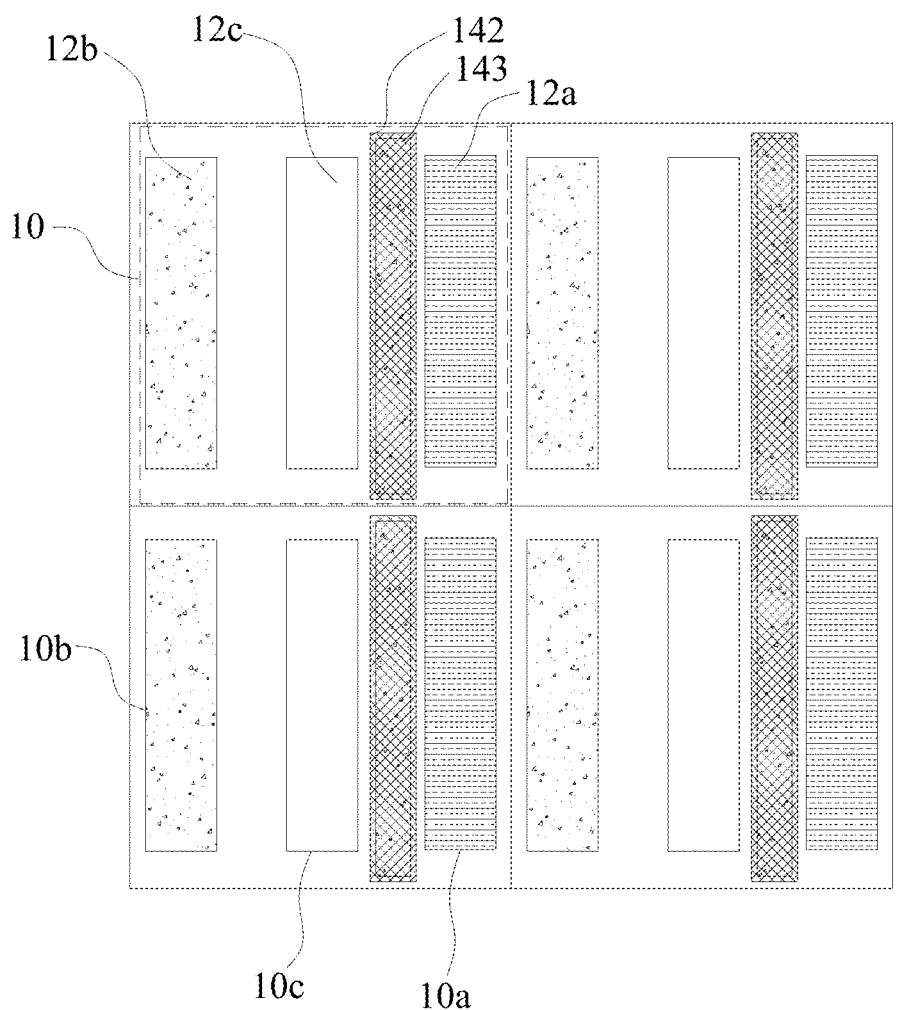
FIG. 11 is a structural diagram of a plurality of sub-pixels arranged in the column direction provided in embodiment 3 or embodiment 8 of the present application.

The third embodiment differs from embodiment 1 in that, as shown in FIG. 11, three sub-pixels in the pixel cell 10 are sequentially arranged at intervals in the same row direction. Each pixel cell 10 includes one anti-view pixel cell, and the anti-view sub-pixel 141 is added between the two sub-pixels to achieve the anti-view function. By adding the anti-view sub-pixel 141 to each pixel cell 10, the design cost of the anti-view sub-pixel 141 can be reduced, thereby reducing the production cost.

Embodiment 4

Figure 12:
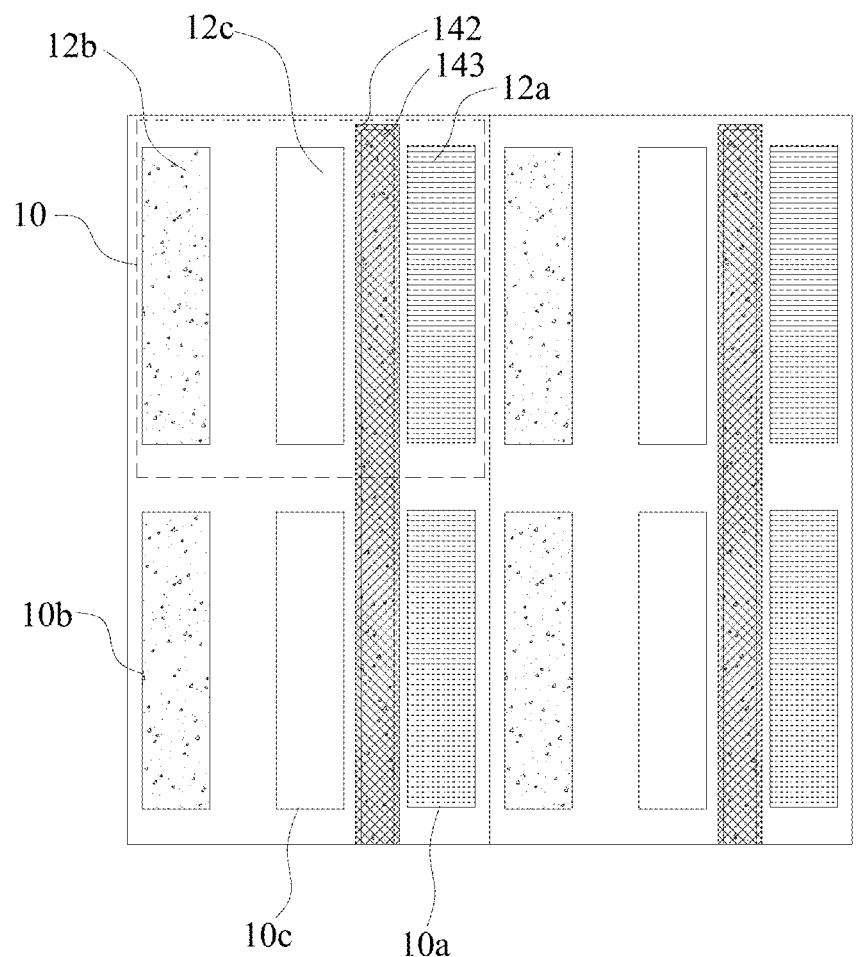
FIG. 12 is a structural diagram of the anti-view sub-pixels extending in the column direction provided in embodiment 4 or embodiment 8 of the present application.

Embodiment 4 differs from embodiment 3 in that, as shown in FIG. 12, the anti-view pixel cell includes one anti-view sub-pixel 141, the anti-view sub-pixel 141 extends in the column direction, and the anti-view sub-pixel 141 penetrates through different pixel cells 10 in the column direction to achieve anti-view. By extending the anti-view sub-pixel 141 in the column direction, the manufacturing process is simplified, and the production cost is reduced. In addition, the anti-view sub-pixel 141 in the same column direction can be turned on or off with one key.

Embodiment 5

Figure 13:
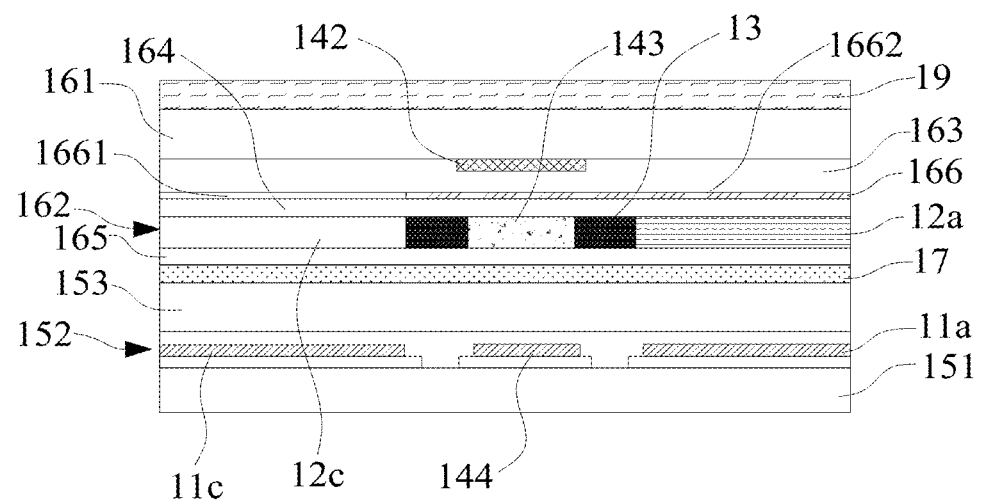
FIG. 13 shows a structural diagram of a polarizing layer arranged on a side of the second substrate plate away from the first substrate plate provided in embodiment 5 or embodiment 8 of the present application.

Embodiment 5 differs from embodiment 1 in that, as shown in FIG. 13, a polarizing layer 19 is provided on the side of the second substrate plate 16 away from the first substrate plate 15 to reduce the reflection intensity of ambient light on the screen.

Embodiment 6

Figure 14:
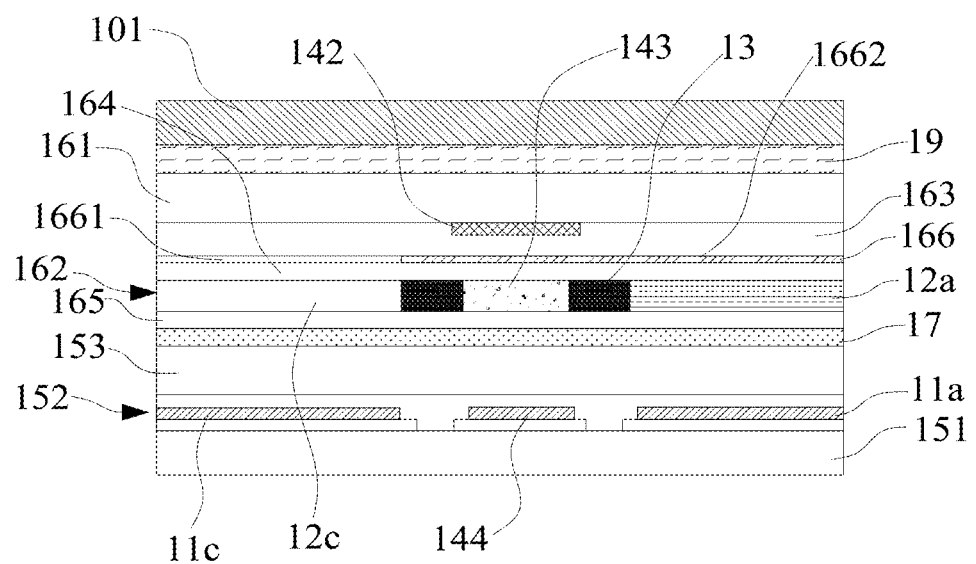
FIG. 14 shows a structural diagram of a polarizing layer and a cover layer provided on the second substrate plate away from the first substrate plate provided in embodiment 6 or embodiment 8 of the present application.
Figure 15:
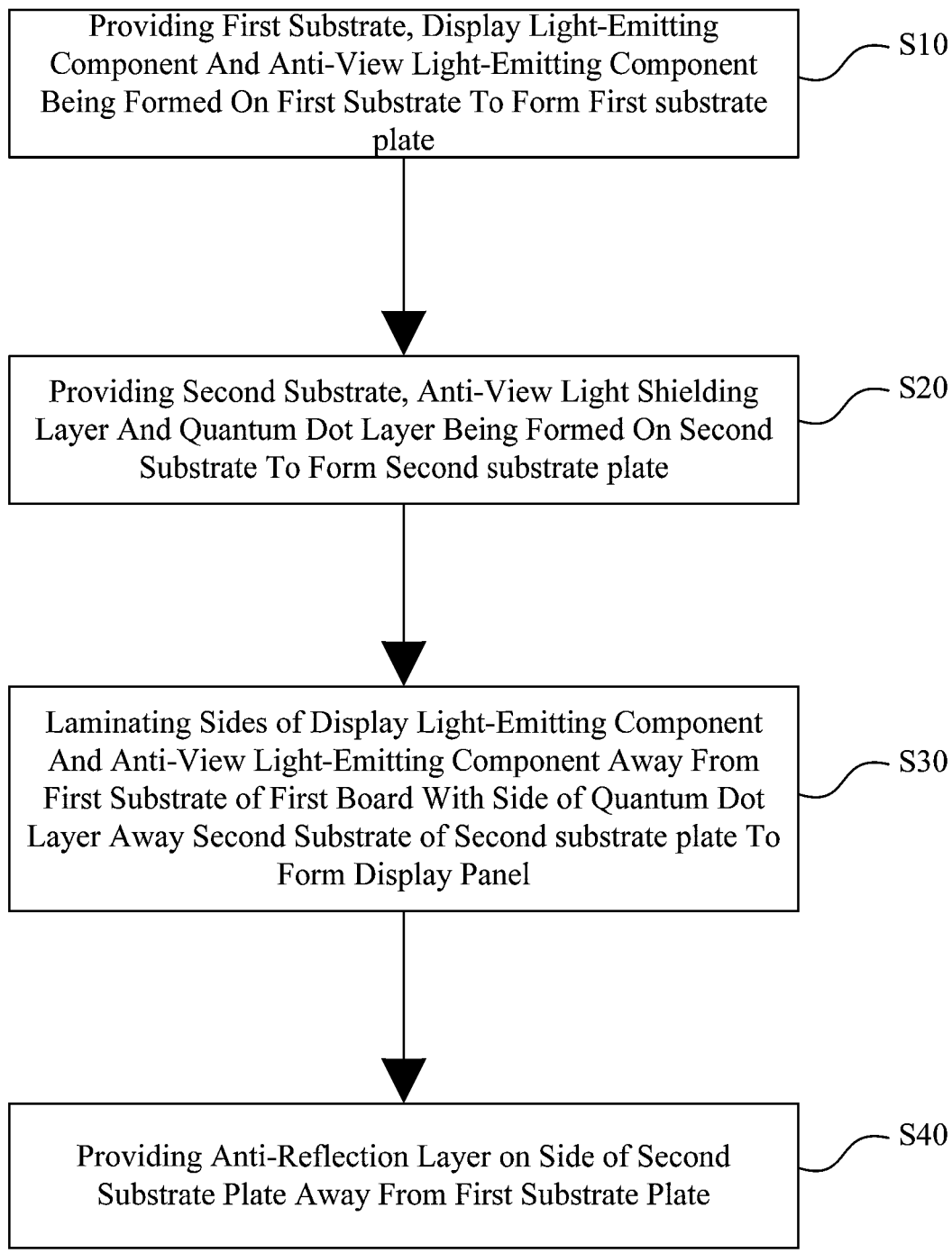
FIG. 15 shows a flowchart diagram of manufacturing the display panel according to any one of embodiment 1 to embodiment 6 in embodiment 7 of the present application.

Embodiment 6 differs from embodiment 5 in that, as shown in FIG. 14, a capping layer 101 is provided on the side of the second substrate plate 16 away from the first substrate plate 15, and the capping layer 101 is provided on a side of the polarizing layer 19 away from the second substrate plate 16.

The capping layer 101 (CPL for short) is provided, the capping layer 101 is formed of lithium fluoride (LiF) or the like, and is used for modulating the microcavity structure to enhance the light emission of the light emitting layer.

Embodiment 7

Embodiment 7 provides a manufacturing method for manufacturing any one of the display panels 1 in embodiments 1 to 6, as shown in FIG. 4, FIG. 5, FIG. 6 and FIG. 15, which comprises the following steps:

Step S10, a first substrate 151 is provided, and a display light-emitting component 11 and an anti-view light-emitting component 144 are formed on the first substrate 151 to form the first substrate plate 15.

Referring to FIG. 5, first, an anode of the display light-emitting component 11 and an anode of the anti-view light-emitting component 144 are formed on a first substrate 151 of the first substrate plate 15, and the anodes of each display light-emitting component 11 are connected to each other to achieve simultaneous turning on or turning off. The anode of the anti-view light-emitting component 144 and the anode of the display light-emitting component 11 are disconnected from each other to achieve one-key switching between the normal display mode and the anti-view mode. Next, a display light-emitting component 11 and an anti-view light-emitting component 144 are formed on the anode. The display light-emitting component 11 and the anti-view light-emitting component 144 may adopt a double-layer or three-layer laminated blue light structure to ensure the brightness of the blue light. Then, a cathode layer is coated on the side of the display light-emitting component 11 and the anti-view light-emitting component 144 away from the first substrate 151. The cathode layer is designed over the whole surface, which simplifies the production process and reduces the production cost. Finally, a first encapsulation layer 153 is encapsulated on the cathode to isolate water and oxygen and protect the display light-emitting component 11 and the anti-view light-emitting component 144.

Step S20, a second substrate 161 is provided, an anti-view light shielding layer 142 and a quantum dot layer 162 are formed on the second substrate 161 to form a second substrate plate 16.

Referring to FIG. 6, first, an anti-view light shielding layer 142 is formed on the second substrate 161. A flat layer 163 is coated on the second substrate 161, and the flat layer 163 covers the anti-view light shielding layer 142. The flat layer 163 is planarized to ensure a flat surface, so that the subsequent film preparation is more compatible. A layer of (1, 3-phenylene) bis (1-(alkoxyphenyl)-1, 3-propanedione) compound is added on the side of the flat layer 163 far away from the second substrate 161, and a corresponding opening area 1661 is opened on the blue light absorption layer 166 to let the blue light to pass through. By adopting the blue light absorption layer 166, the process of the color resistance layer is removed, which can reduce the process difficulty, greatly improve the process yield and reduce the production cost. A second encapsulation layer 164 is formed on a side of the blue light absorption layer 166 away from the second substrate 161. A plurality of light shielding posts 13 are formed on the second encapsulation layer 164, and quantum dots are filled between the adjacent light shielding posts 13. A transparent cell 12c is formed using an organic insulating dielectric material (OC) at a position corresponding to the opening area 1661 without filling quantum dots, thereby forming a quantum dot layer 162. In order to prevent the quantum dots from leaking out, a third encapsulation layer 165 is further provided on the side of the quantum dot layer 162 away from the second substrate 161, and the quantum dots are encapsulated between the light shielding posts 13 and the second encapsulation layer 164 as well as the third encapsulation layer 165 to avoid leakage.

Step S30, the sides of the display light-emitting component 11 and the anti-view light-emitting component 144 away from the first substrate 151 of the first substrate plate 15 are laminated with the side of the quantum dot layer 162 away from the second substrate 161 of the second substrate plate 16 to form the display panel 1, forming a structure as shown in FIG. 4, FIG. 7 or FIG. 8.

When the first substrate plate 15 and the second substrate plate 16 are connected by bonding, a bonding layer 17 is bonded to the side of the first encapsulation layer 153 in the first substrate plate 15 away from the first substrate 151, and the second substrate plate 16 is aligned with the first substrate plate 15. Since both sides of the bonding layer 17 have adhesion, the third encapsulation layer 165 in the second substrate plate 16 is bonded to the bonding layer 17. The first substrate plate 15 and the second substrate plate 16 are connected by the bonding layer 17 so that they are more tightly connected and are not easy to fall off.

When the first substrate plate 15 and the second substrate plate 16 are connected by electrostatic adsorption, the bonding layer 17 is eliminated between the first substrate plate 15 and the second substrate plate 16. Electrostatic adsorption is used, that is, the side of the first encapsulation layer 153 away from the first substrate 151 and the side of the third encapsulation layer 165 away from the second substrate 161 in the first substrate plate 15 are double-substrate bonded.

By designing the display panel 1 having two substrate plates, the anti-view light-shielding layer 142 and the quantum dot layer 162 can be disposed on the substrate plate different from that the display light-emitting component 11 and the anti-view light-emitting component 144 are on, so that fabrication of the anti-view light-shielding layer 142 and the quantum dot layer 162 using a conventional non-OLED low-temperature process can be achieved.

Step S40, an anti-reflection layer 18 is arranged on the side of the second substrate plate 16 away from the first substrate plate 15, as shown in FIG. 9. The anti-reflection layer 18 can reduce the reflection intensity of ambient light on the screen, thereby eliminating the polarizer of the display panel 1, thereby not only reducing the overall thickness of the display panel 1, but also possibly improving the light output rate, greatly increasing the light output brightness, and reducing the power consumption of the display panel 1.

Embodiment 8

Figure 16:
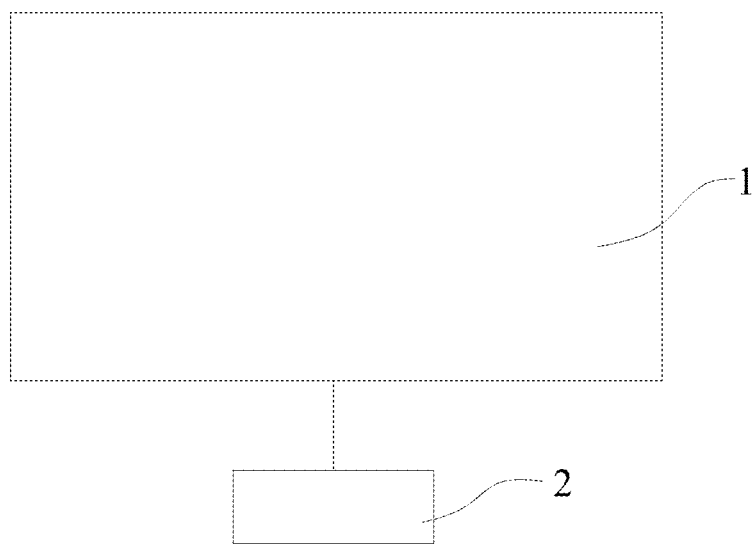
FIG. 16 shows a structural diagram of a display device connected with a main board provided in embodiment 8 of the present application.

The present application also provides a display device, which is shown in FIG. 16. The display device comprises a display panel 1 and a main board 2. The main board 2 is connected to the display panel 1 and is used for driving the display panel 1 to display an image. The display panel 1 includes the display panel 1 disclosed in any one of embodiments 1 to 6 and will not be described here in detail. Reference can be made to embodiments 1 to 6 in detail.

The display device may be any electronic device having a display function such as a mobile phone, a tablet computer, a notebook computer, an e-book or a television.

In the content of the description, illustrations of the reference terms "some embodiments," "example," etc, mean that specific features, structures, materials, or characteristics described in connection with the embodiment or example are encompassed in at least one embodiment or example of the present application. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may combine and incorporate different embodiments or examples described in the description and features of different embodiments or examples.

Although embodiments of the present application have been shown and described above, it will be understood that the above-mentioned embodiments are exemplary and cannot be construed as limiting the present application. Those of ordinary skill in the art may make changes, variations, alternatives and modifications to the above-mentioned embodiments within the scope of the present application. Therefore, any changes or modifications made in accordance with the claims and descriptions of the present application should fall within the scope of the patent of the present application.

What is claimed is:

1. A display panel, comprising:
  a first substrate plate comprising a first substrate and a blue light-emitting layer formed on the first substrate, wherein the blue light-emitting layer comprises a plurality of display light-emitting components arranged at intervals and an anti-view light-emitting component arranged at least between two of the plurality of display light-emitting components; and
  a second substrate plate, wherein the second substrate plate and the first substrate plate are arranged by cell assembling, and the second substrate plate comprises:
    a second substrate opposite to the first substrate;
    an anti-view light shielding layer arranged on a side of the second substrate towards the first substrate, wherein an orthographic projection of the anti-view light-emitting component on the first substrate is located within an orthographic projection of the anti-view light shielding layer on the first substrate; and
    a quantum dot layer disposed at a side of the anti-view light shielding layer away from the second substrate and comprising a display quantum dot cell and an anti-view quantum dot cell arranged at intervals with each other, wherein the display quantum dot cell is disposed opposite to the plurality of display light-emitting components, an orthographic projection of the anti-view quantum dot cell on the first substrate overlaps the orthographic projection of the anti-view light-emitting component on the first substrate, and the anti-view quantum dot cell is different in color from at least one display quantum dot cell adjacent to the anti-view quantum dot cell.

2. The display panel according to claim 1, wherein the second substrate plate further comprises a blue light absorption layer disposed between the anti-view light shielding layer and the quantum dot layer, wherein the blue light absorption layer comprises an opening area and an absorption area arranged around the opening area, wherein the opening area allows at least a part of blue light emitted by the plurality of display light-emitting components to pass through, and the absorption area is capable of absorbing the blue light.

3. The display panel according to claim 1, wherein the first substrate plate and the second substrate plate are laminated.

4. The display panel according to claim 3, wherein the display panel further comprises a bonding layer, one side of the bonding layer is bonded to a side of the blue light-emitting layer away from the first substrate, and another side of the bonding layer is bonded to a side of the quantum dot layer away from the second substrate.

5. The display panel according to claim 3, wherein the side of the blue light-emitting layer away from the first substrate is connected to the side of the quantum dot layer away from the second substrate by electrostatic adsorption.

6. The display panel according to claim 1, wherein the display panel further comprises a plurality of pixel cells arranged in an array, wherein each of the plurality of pixel cells comprises a first blue light-emitting component, a second blue light-emitting component, a third blue light-emitting component and an anti-view light-emitting component, and the anti-view light-emitting component is arranged between two adjacent blue light-emitting components; and
  wherein each of the plurality of pixel cells further comprises a red quantum dot cell, a green quantum dot cell, a transparent cell and the anti-view quantum dot cell, wherein the red quantum dot cell, the green quantum dot cell and the transparent cell correspond one-to-one with the first blue light-emitting component, the second blue light-emitting component and the third blue light-emitting component.

7. The display panel according to claim 6, wherein a light shielding post is arranged between any two of the red quantum dot cell, the green quantum dot cell, the transparent cell and the anti-view quantum dot cell.

8. The display panel according to claim 1, wherein the second substrate plate further comprises a flat layer, the flat layer is arranged on the second substrate, and the flat layer covers the anti-view light shielding layer; or
  wherein the display panel further comprises an anti-reflection layer arranged on a side of the second substrate plate away from the first substrate plate.

9. The display panel according to claim 1, wherein the second substrate plate further comprises a flat layer, the flat layer is arranged on the second substrate, and the flat layer covers the anti-view light shielding layer; and
  wherein the display panel further comprises an anti-reflection layer arranged on a side of the second substrate plate away from the first substrate plate.

10. A method of manufacturing a display panel, comprising:
  providing a first substrate, a display light-emitting component and an anti-view light-emitting component being formed on the first substrate to form a first substrate plate;
  providing a second substrate, an anti-view light shielding layer and a quantum dot layer being formed on the second substrate to form a second substrate plate; and
  laminating sides of the display light-emitting component and the anti-view light-emitting component away from the first substrate of the first substrate plate with a side of the quantum dot layer away from the second substrate of the second substrate plate to form the display panel.

11. A display device comprising a main board and a display panel electrically connected to the main board:
  wherein the display panel comprises:
    a first substrate plate comprising a first substrate and a blue light-emitting layer formed on the first substrate, wherein the blue light-emitting layer comprises a plurality of display light-emitting components arranged at intervals and an anti-view light-emitting component arranged at least between two of the plurality of display light-emitting components; and a second substrate plate, wherein the second substrate plate and the first substrate plate are arranged by cell assembling, and the second substrate plate comprises:
a second substrate opposite to the first substrate;
an anti-view light shielding layer arranged on a side of the second substrate towards the first substrate, wherein an orthographic projection of the anti-view light-emitting component on the first substrate is located within an orthographic projection of the anti-view light shielding layer on the first substrate; and
a quantum dot layer disposed at a side of the anti-view light shielding layer away from the second substrate and comprising a display quantum dot cell and an anti-view quantum dot cell arranged at intervals with each other, wherein the display quantum dot cell is disposed opposite to the plurality of display light-emitting components, an orthographic projection of the anti-view quantum dot cell on the first substrate overlaps the orthographic projection of the anti-view light-emitting component on the first substrate, and the anti-view quantum dot cell is different in color from at least one display quantum dot cell adjacent to the anti-view quantum dot cell.

12. The display device according to claim 11, wherein the second substrate plate further comprises a blue light absorption layer disposed between the anti-view light shielding layer and the quantum dot layer, wherein the blue light absorption layer comprises an opening area and an absorption area arranged around the opening area, wherein the opening area allows at least a part of blue light emitted by the plurality of display light-emitting components to pass through, and the absorption area is capable of absorbing the blue light.

13. The display device according to claim 11, wherein the first substrate plate and the second substrate plate are laminated.

14. The display device according to claim 13, wherein the display panel further comprises a bonding layer, one side of the bonding layer is bonded to a side of the blue light-emitting layer away from the first substrate, and another side of the bonding layer is bonded to a side of the quantum dot layer away from the second substrate.

15. The display device according to claim 13, wherein the side of the blue light-emitting layer away from the first substrate is connected to the side of the quantum dot layer away from the second substrate by electrostatic adsorption.

16. The display device according to claim 11, wherein the display panel further comprises a plurality of pixel cells arranged in an array, wherein each of the plurality of pixel cells comprises a first blue light-emitting component, a second blue light-emitting component, a third blue light-emitting component and the anti-view light-emitting component, and the anti-view light-emitting component is arranged between two adjacent blue light-emitting components; and
wherein each of the plurality of pixel cells further comprises a red quantum dot cell, a green quantum dot cell, a transparent cell and an anti-view quantum dot cell, wherein the red quantum dot cell, the green quantum dot cell and the transparent cell correspond one-to-one with the first blue light-emitting component, the second blue light-emitting component and the third blue light-emitting component.

17. The display device according to claim 16, wherein a light shielding post is arranged between any two of the red quantum dot cell, the green quantum dot cell, the transparent cell and the anti-view quantum dot cell.

18. The display device according to claim 11, wherein the second substrate plate further comprises a flat layer, the flat layer is arranged on the second substrate, and the flat layer covers the anti-view light shielding layer: or
wherein the display panel further comprises an anti-reflection layer arranged on a side of the second substrate plate away from the first substrate plate.

19. The display device according to claim 11, wherein the second substrate plate further comprises a flat layer, the flat layer is arranged on the second substrate, and the flat layer covers the anti-view light shielding layer; and
wherein the display panel further comprises an anti-reflection layer arranged on a side of the second substrate plate away from the first substrate plate.

* * * * *